US00RE49166E

(19) United States
(12) Reissued Patent
Ono et al.

(10) Patent Number: US RE49,166 E
(45) Date of Reissued Patent: Aug. 9, 2022

(54) DISPLAYS WITH SILICON AND SEMICONDUCTING-OXIDE TOP-GATE THIN-FILM TRANSISTORS

(71) Applicant: Apple Inc., Cupertino, CA (US)

(72) Inventors: Shinya Ono, Cupertino, CA (US); Chin-Wei Lin, San Jose, CA (US); Ching-Sang Chuang, Sunnyvale, CA (US); Jiun-Jye Chang, Cupertino, CA (US); Keisuke Omoto, Odawara (JP); Shang-Chih Lin, Los Altos, CA (US); Ting-Kuo Chang, San Jose, CA (US); Takahide Ishii, Taoyuan (TW)

(73) Assignee: Apple Inc., Cupertino, CA (US)

(21) Appl. No.: 16/845,526

(22) Filed: Apr. 10, 2020

Related U.S. Patent Documents

Reissue of:
(64) Patent No.: 10,249,695
Issued: Apr. 2, 2019
Appl. No.: 15/729,330
Filed: Oct. 10, 2017

U.S. Applications:
(60) Provisional application No. 62/476,551, filed on Mar. 24, 2017.

(51) Int. Cl.
*H01L 27/12* (2006.01)
*H01L 27/32* (2006.01)
*H01L 29/786* (2006.01)

(52) U.S. Cl.
CPC ..... *H01L 27/1225* (2013.01); *H01L 27/1222* (2013.01); *H01L 27/1248* (2013.01); *H01L 27/1255* (2013.01); *H01L 27/3248* (2013.01); *H01L 27/3258* (2013.01); *H01L 27/3262* (2013.01); *H01L 27/3265* (2013.01); *H01L 27/3276* (2013.01); *H01L 29/7869* (2013.01); *H01L 29/78675* (2013.01)

(58) Field of Classification Search
CPC ..... H01L 27/1225; H01L 29/7869; H01L 27/1248; H01L 27/3258; H01L 27/3276; H01L 27/3262; H01L 27/1222; H01L 27/3248; H01L 27/1255; H01L 27/3265; H01L 29/78675
See application file for complete search history.

(56) References Cited

U.S. PATENT DOCUMENTS 9,397,124 B2 7/2016 Choi et al.
9,466,615 B2 * 10/2016 Miyairi ..... H01L 27/1225
9,494,833 B2 11/2016 Yamazaki et al.
9,543,370 B2 1/2017 Tsai et al.
9,768,323 B2 * 9/2017 Ge ..... H01L 21/02565
(Continued)

*Primary Examiner* — Minh Nguyen
(74) *Attorney, Agent, or Firm* — Treyz Law Group, P.C.; Jason Tsai

(57) ABSTRACT

An electronic device may include a display having an array of display pixels on a substrate. The display pixels may be organic light-emitting diode display pixels, that include hybrid thin-film transistor structures formed using semiconducting-oxide thin-film transistors, silicon thin-film transistors, and capacitor structures. A drive transistor in the display pixel may be a top-gate semiconducting-oxide thin-film transistor and a switching transistor in the display pixel may be a top-gate silicon thin-film transistor. A storage capacitor in the display may include a conductive semiconducting-oxide electrode.

23 Claims, 14 Drawing Sheets

(56) References Cited

U.S. PATENT DOCUMENTS

| | | | | |
|---|---|---|---|---|
| 9,799,677 | B2 * | 10/2017 | Ge | H01L 29/7869 |
| 2011/0309362 | A1 * | 12/2011 | Yoon | G02F 1/136213 257/59 |
| 2013/0214279 | A1 | 8/2013 | Nishimura et al. | |
| 2015/0055051 | A1 * | 2/2015 | Osawa | H01L 27/1225 349/48 |
| 2015/0060814 | A1 * | 3/2015 | Noh | H01L 27/3272 257/40 |
| 2016/0043070 | A1 * | 2/2016 | Momo | H01L 29/66742 257/296 |
| 2016/0149042 | A1 * | 5/2016 | Sato | H01L 29/7869 257/43 |
| 2016/0163745 | A1 * | 6/2016 | Choi | H01L 27/1251 257/40 |
| 2016/0276370 | A1 * | 9/2016 | Miyairi | H01L 27/1207 |
| 2017/0141233 | A1 * | 5/2017 | Shimomura | H01L 29/7869 |
| 2017/0287943 | A1 * | 10/2017 | Ma | H01L 29/24 |
| 2017/0352746 | A1 * | 12/2017 | Yamazaki | H01L 21/02565 |

* cited by examiner

DISPLAYS WITH SILICON AND SEMICONDUCTING-OXIDE TOP-GATE THIN-FILM TRANSISTORS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application claims the benefit of provisional patent application No. 62/476,551, filed on Mar. 24, 2017, *and is a reissue of patent application Ser. No. 15/729,330, now U.S. Pat. No. 10,249,695,* which [is] *are* hereby incorporated by reference herein in [its entirety] *their entireties*.

BACKGROUND

This relates generally to electronic devices and, more particularly, to electronic devices with displays that have thin-film transistors.

Electronic devices often include displays. For example, cellular telephones and portable computers include displays for presenting information to users.

Displays such as liquid crystal displays are formed from multiple layers. A liquid crystal display may, for example, have upper and lower polarizer layers, a color filter layer that contains an array of color filter elements, a thin-film transistor layer that includes thin-film transistors and display pixel electrodes, and a layer of liquid crystal material interposed between the color filter layer and the thin-film transistor layer. Each display pixel typically includes a thin-film transistor for controlling application of a signal to display pixel electrode structures in the display pixel.

Displays such as organic light-emitting diode displays have an array of display pixels based on light-emitting diodes. In this type of display, each display pixel includes a light-emitting diode and thin-film transistors for controlling application of a signal to the light-emitting diode.

Thin-film display driver circuitry is often included in displays. For example, gate driver circuitry and demultiplexer circuitry on a display may be formed from thin-film transistors.

If care is not taken, thin-film transistor circuitry in the display pixels and display driver circuitry of a display may exhibit non-uniformity, excessive leakage currents, insufficient drive strengths, poor area efficiency, hysteresis, and other issues.

It is within this context that the embodiments herein arise.

SUMMARY

An electronic device may be provided with a display. The display may have an array of display pixels on a substrate. The display pixels may be organic light-emitting diode display pixels or display pixels in a liquid crystal display.

The display may include a display pixel with at least an organic light-emitting diode (OLED) a semiconducting-oxide thin-film transistor (e.g., a drive transistor), a silicon thin-film transistor (e.g., a switching transistor), and a storage capacitor coupled to the drive transistor. The switching transistor, the drive transistor, and a light-emitting diode may be coupled in series between a positive voltage power supply line and a ground voltage power supply line. In particular, the drive transistor may be a top-gate semiconducting-oxide transistor. The switching transistor may be a top-gate silicon transistor. The storage capacitor may include a conductive semiconducting-oxide as a first electrode.

The silicon switching transistor may be formed on a substrate, and the semiconducting-oxide drive transistor may be formed above the silicon switching transistor. A conductive routing path may couple the silicon switching transistor to the semiconducting-oxide drive transistor. The conductive routing path may be covered by an organic layer formed on the drive transistor. An additional organic layer may be formed on the organic layer. An anode layer of the light-emitting diode may be formed on the additional organic layer.

In an embodiment, an etch-stop liner may be interposed between a source-drain terminal of the semiconducting-oxide drive transistor and a contact of the conductive routing path coupled to the semiconducting-oxide drive transistor.

In an embodiment, a dielectric layer may be formed below the semiconducting transistor, and the conductive semiconducting-oxide of the storage capacitor and semiconducting-oxide material in the drive transistor may be formed on the dielectric layer.

In an embodiment, the silicon switching transistor comprises a gate structure formed in the same layer as a capacitor plate of the storage capacitor.

In an embodiment, a passivation layer is interposed between the conductive path coupling and the organic layer.

DETAILED DESCRIPTION

Figure 1:
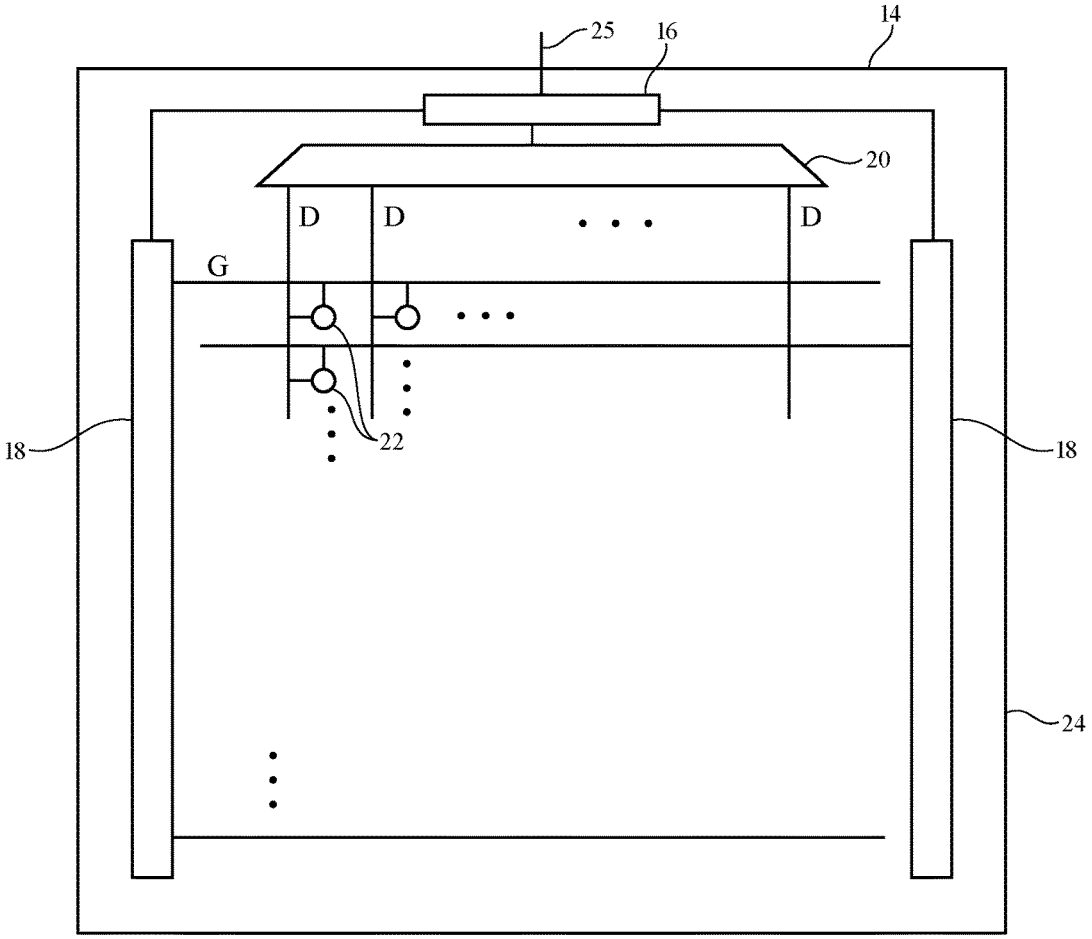
FIG. 1 is a diagram of an illustrative display such as an organic light-emitting diode display having an array of organic light-emitting diode display pixels or a liquid crystal display having an array of display pixels in accordance with an embodiment.

A display in an electronic device may be provided with driver circuitry for displaying images on an array of display pixels. An illustrative display is shown in FIG. 1. As shown in FIG. 1, display 14 may have one or more layers such as substrate 24. Layers such as substrate 24 may be formed from planar rectangular layers of material such as planar glass layers. Display 14 may have an array of display pixels 22 for displaying images for a user. The array of display pixels 22 may be formed from rows and columns of display pixel structures on substrate 24. There may be any suitable number of rows and columns in the array of display pixels 22 (e.g., ten or more, one hundred or more, or one thousand or more).

Display driver circuitry such as display driver integrated circuit 16 may be coupled to conductive paths such as metal traces on substrate 24 using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The control circuitry may be located on a main logic board in an electronic device such as a cellular telephone, computer, set-top box, media player, portable electronic device, or other electronic equipment in which display 14 is being used. During operation, the control circuitry may supply display driver integrated circuit 16 with information on images to be displayed on display 14. To display the images on display pixels 22, display driver integrated circuit 16 may supply corresponding image data to data lines D while issuing clock signals and other control signals to supporting thin-film transistor display driver circuitry such as gate driver circuitry 18 and demultiplexing circuitry 20.

Gate driver circuitry 18 may be formed on substrate 24 (e.g., on the left and right edges of display 14, on only a single edge of display 14, or elsewhere in display 14). Demultiplexer circuitry 20 may be used to demultiplex data signals from display driver integrated circuit 16 onto a plurality of corresponding data lines D. With this illustrative arrangement of FIG. 1, data lines D run vertically through display 14. Each data line D is associated with a respective column of display pixels 22. Gate lines G run horizontally through display 14. Each gate line G is associated with a respective row of display pixels 22. Gate driver circuitry 18 may be located on the left side of display 14, on the right side of display 14, or on both the right and left sides of display 14, as shown in FIG. 1.

Gate driver circuitry 18 may assert gate signals (sometimes referred to as scan signals) on the gate lines Gin display 14. For example, gate driver circuitry 18 may receive clock signals and other control signals from display driver integrated circuit 16 and may, in response to the received signals, assert a gate signal on gate lines G in sequence, starting with the gate line signal G in the first row of display pixels 22. As each gate line is asserted, the corresponding display pixels in the row in which the gate line is asserted will display the display data appearing on the data lines D.

Display driver circuitry such as demultiplexer circuitry 20 and gate line driver circuitry 18 may be formed from thin-film transistors on substrate 24. Thin-film transistors may also be used in forming circuitry in display pixels 22. To enhance display performance, thin-film transistor structures in display 14 may be used that satisfy desired criteria such as leakage current, switching speed, drive strength, uniformity, etc. The thin-film transistors in display 14 may, in general, be formed using any suitable type of thin-film transistor technology (e.g., silicon-based, semiconducting-oxide-based, etc.).

With one suitable arrangement, which is sometimes described herein as an example, the channel region (active region) in some thin-film transistors on display 14 is formed from silicon (e.g., silicon such as polysilicon deposited using a low temperature process, sometimes referred to as LTPS or low-temperature polysilicon) and the channel region in other thin-film transistors on display 14 is formed from a semiconducting-oxide material (e.g., amorphous indium gallium zinc oxide, sometimes referred to as IGZO). If desired, other types of semiconductors may be used in forming the thin-film transistors such as amorphous silicon, semiconducting-oxides other than IGZO, etc. In a hybrid display configuration of this type, silicon transistors (e.g., LTPS transistors) may be used where attributes such as switching speed and good drive current are desired (e.g., for gate drivers in liquid crystal diode displays or in portions of an organic light-emitting diode display pixel where switching speed is a consideration), whereas oxide transistors (e.g., IGZO transistors) may be used where low leakage current is desired (e.g., in liquid crystal diode display pixels and display driver circuitry) or where high pixel-to-pixel uniformity is desired (e.g., in an array of organic light-emitting diode display pixels). Other considerations may also be taken into account (e.g., considerations related to power consumption, real estate consumption, hysteresis, etc.).

Oxide transistors such as IGZO thin-film transistors are generally n-channel devices (i.e., NMOS transistors). Silicon transistors can be fabricated using p-channel or n-channel designs (i.e., LTPS devices may be either PMOS or NMOS). Combinations of these thin-film transistor structures can provide optimum performance.

Figure 2:
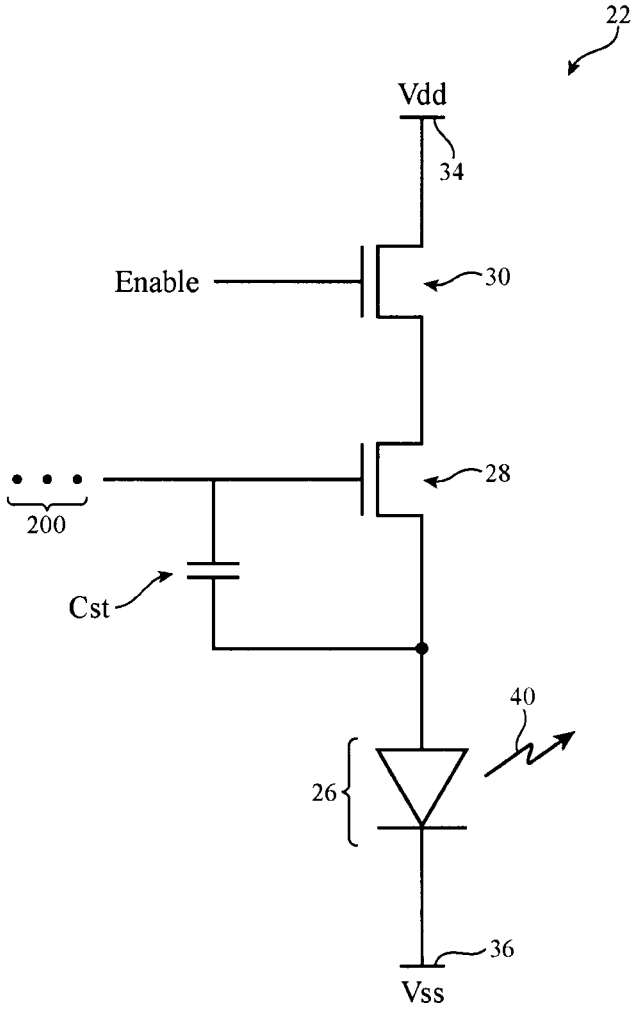
FIG. 2 is a diagram of an illustrative organic light-emitting diode display pixel of the type that may include an organic light-emitting diode with semiconducting-oxide top-gate thin-film transistors and silicon top gate thin-film transistors in accordance with an embodiment.

Embodiments below may be described with organic light-emitting diode technology as an example. However, if desired these embodiments may also be applied to liquid crystal display technology In an organic light-emitting diode display, each display pixel contains a respective organic light-emitting diode. A schematic diagram of an illustrative organic light-emitting diode display pixel 22 is shown in FIG. 2. As shown in FIG. 2, display pixel 22 may include light-emitting diode 26. A positive power supply voltage Vdd may be supplied to positive power supply terminal 34 and a ground power supply voltage Vss may be supplied to ground power supply terminal 36. The state of drive transistor 28 controls the amount of current flowing through diode 26 and therefore the amount of emitted light 40 from display pixel 22.

To ensure that transistor 28 is held in a desired state between successive frames of data, display pixel 22 may include a storage capacitor such as storage capacitor Cst. The voltage on storage capacitor Cst is applied across the gate and source terminals of transistor 28 to control drive transistor 28, thereby controlling the amount of current flowing through light-emitting diode 26.

Pixel 22 may also include switching transistor 30 (sometimes referred to herein as enable transistor 30). Transistor 30 may be coupled between positive power supply terminal 34 and drive transistor 28. An enable signal may be coupled to the gate terminal of transistor 30 to further control the current flow from positive supply terminal 34 to light-emitting diode 26.

Pixel 22 may further include additional circuitry as indicated by ellipses 200. In particular, pixel 22 may include an additional switching transistor (distinct from switching transistor 30) that loads data into storage capacitor Cst. As an example, the additional switching transistor may be controlled by gate line G (as shown in FIG. 1) and may convey information from data line D (shown in FIG. 1) to storage capacitor Cst. When the switching transistor is off, data line D is isolated from storage capacitor Cst and the gate voltage of transistor 28 is equal to the data value stored in storage capacitor Cst (i.e., the data value from the previous frame of display data being displayed on display 14). When gate line G (sometimes referred to as a scan line) in the row associated with display pixel 22 is asserted, the switching transistor will be turned on and a new data signal on data line D will be loaded into storage capacitor Cst. The new signal on capacitor Cst is applied to the gate terminal of transistor 28, thereby adjusting the state of transistor 28 and adjusting the corresponding amount of light 40 that is emitted by light-emitting diode 26.

Figure 3A:
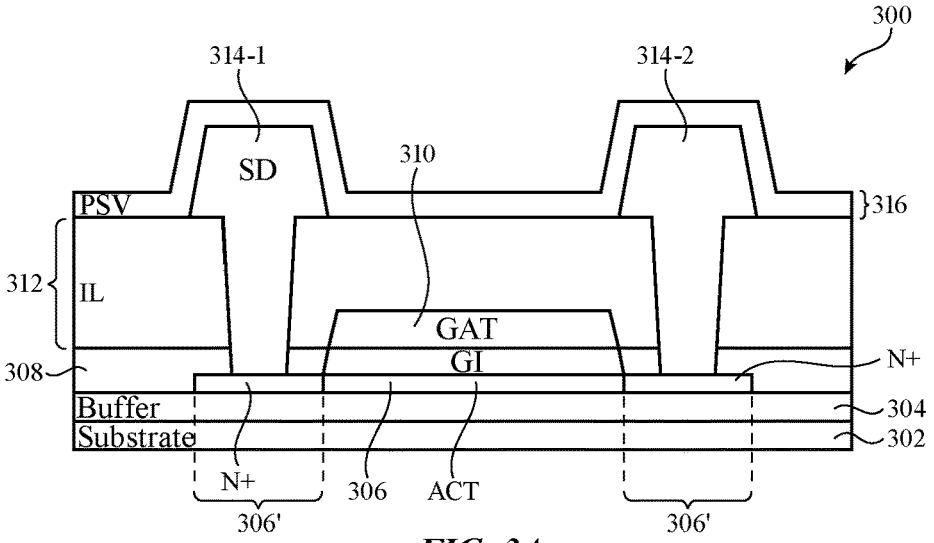
FIGS. 3A-3C are diagrams of illustrative top-gate indium gallium zinc oxide (IGZO) transistor structures in accordance with an embodiment.
Figure 3B:
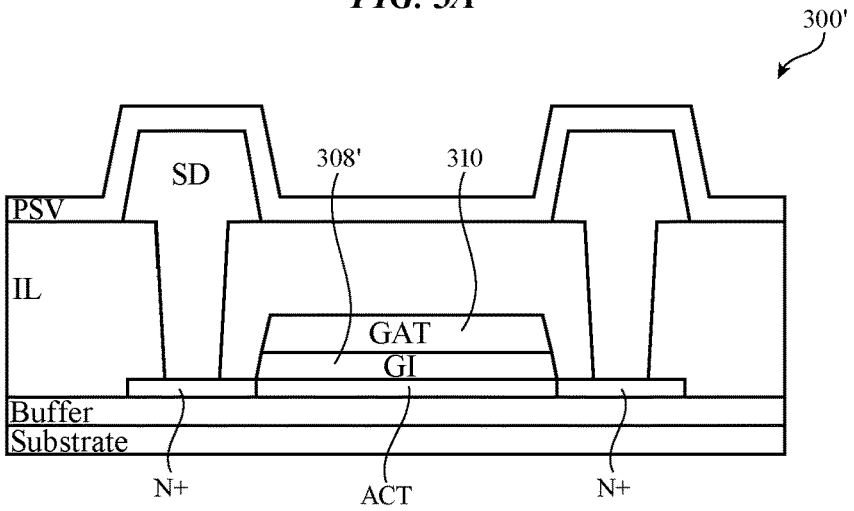
Figure 3C:
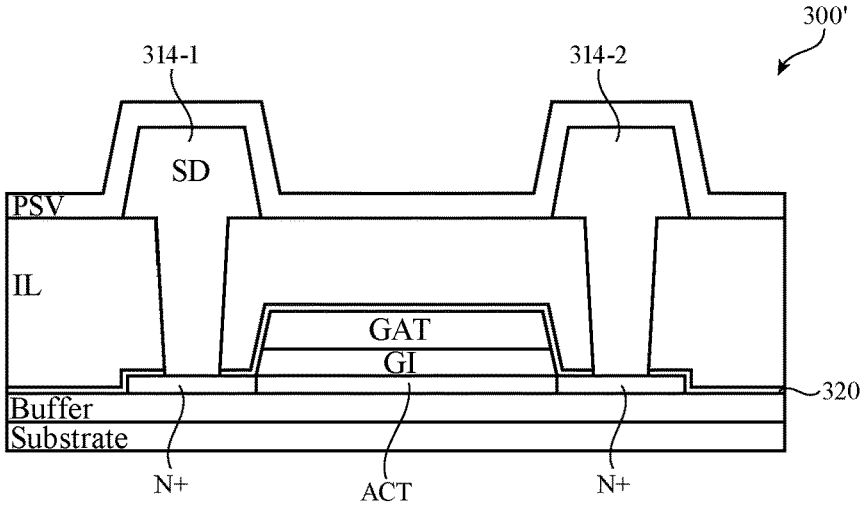

Display pixels such as organic light-emitting diode pixel 22 of FIG. 2 may include transistors that use top-gate thin-film transistor structures of the type shown in FIGS. 3A-3C. In particular, FIG. 3A shows top gate transistor structure 300 formed by hydrogenation using silicon nitride or ion implantation. Transistor structure 300 includes substrate layer 302 and buffer layer 304 formed on top of substrate layer 302. Additionally, an indium gallium zinc oxide layer (i.e., IGZO layer) may be formed on top of buffer layer 304. In particular, the IGZO layer may include three portions, active region 306 and two source-drain regions 306'. Source-drain regions 306' may be heavily n-doped (e.g., heavily doped by electron donor impurities).

Gate insulator layer 308 may be formed on top of the IGZO layer, and gate structure 310 may be formed over the gate insulator layer 308 on top of a region directly above active region 306 of the IGZO layer. Insulation layer 312 may be formed over corresponding portions of gate insulation layer 308 and gate structure 310. Contact holes 314-1 and 314-2 for source-drain regions 306' of the IGZO layer (i.e., source-drain of transistor structure 300) may be formed by etching through gate insulator layer 308 and insulation layer 312. Passivation layer 316 may be formed over contact holes 314-1 and 314-2 for respective source-drain regions 306'.

In an embodiment, source-drain regions of transistor structure 300 of FIG. 3A may be formed by a hydrogenation process using silicon nitride. It may be preferable to use silicon nitride as insulation layer 312 to diffuse dopants (e.g., hydrogen) into source-drain regions 306' in the hydrogenation process. Additionally, dopants may also diffuse into active region 306 (sometimes referred to herein as channel region 306), thereby shortening the effective channel region of transistor structure 300. These characteristics of the hydrogenation step may lead to less source-drain region dopant concentration control.

In an embodiment, source-drain regions of transistor structure 300 of FIG. 3A may be formed by an ion implantation process. The ion implantation process may necessitate a thickness limit on insulation layer 312 (e.g., a thickness less than 200 nm). For example, insulation layer 312 may act as a mask when doping source-drain regions 306' using an ion implantation process. In such a way, the ion implantation process may provide better doping concentration control (as compared to the previously described hydrogenation process).

In an embodiment, as shown in FIG. 3B, transistor structure 300' may be formed using plasma treatment. Similar structure previously described in connection with FIG. 3A will not be further described in FIG. 3B in order to not unnecessarily obscure the present embodiment.

While transistor structure 300 of FIG. 3A may have a gate insulator layer 308 that is patterned by contact holes 314, transistor structure 300 of FIG. 3B may include gate insulator layer 308', which is patterned using gate structure 310. For example, gate structure 310 and gate insulator 308' may be simultaneously etched (e.g., etched in the same processing step) to form the pattern as shown in FIG. 3B using a dry etch process (e.g., plasma treatment). Because source-drain regions 306' may also be exposure during the plasma treatment, source-drain regions 306' may increase in conductivity. If desired, additional plasma treatment (e.g., using Argon, Hydrogen, Helium) to further activate (e.g., increase the conductivity of) source-drain regions 306'.

Figure 4:
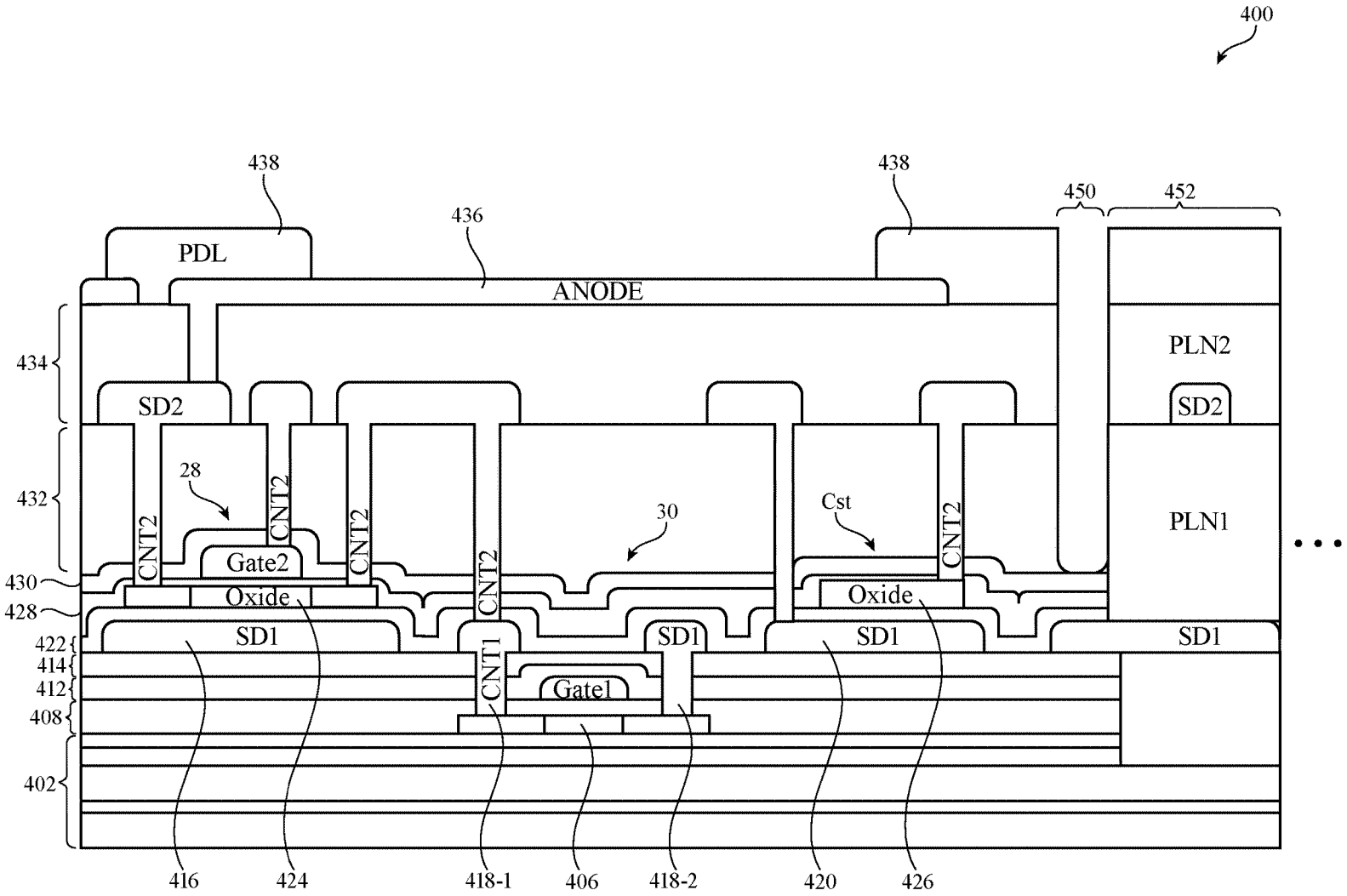
FIG. 4 is a cross-sectional side view of illustrative pixel circuitry that includes a top-gate IGZO drive transistor of the type shown in FIG. 3A in accordance with an embodiment.

In an embodiment, as shown in FIG. 3C, transistor structure 300' may also include barrier layer 320 formed over source drain regions 306'. Portions of barrier layer 320 may be etched away to form contacts to source-drain regions 306' (e.g., to form contacts 314-1 and 314-2). Barrier layer 320 may be formed from alumina to act as a hydrogen barrier layer, as an example. Other suitable barrier materials may also be used. In the scenario in which source-drain regions 306' directly contact insulation layer 312 (as shown in FIG. 3B), diffusion may occur across interface between source-drain region 306' and insulation layer 312. The diffusion may increase the resistance of source-drain regions 306, especially in high temperature settings, thereby leading to lower thermal stability of source-drain regions 306'. By forming barrier layer 320 (as shown in FIG. 3C) diffusion out of source-drain regions (into insulation layer 312) may be minimized Top-gate IGZO transistor structures (i.e., transistor structures in which the gating element is formed above the gate insulator and channel region) as shown in FIGS. 3A-3C may be implemented within various transistor circuitry of pixel 22. In particular, as shown in FIG. 4 drive transistor 28 may be formed using transistor structure 300 as described in FIG. 3A. Circuitry 400 of FIG. 4 may also include switching transistor 30 formed as a top-gate LTPS transistor and storage capacitor Cst having a conductive IGZO electrode.

A cross-sectional view of pixel circuitry 400 is shown in FIG. 4. Pixel circuitry 400 may include transistors 28 and 30 formed over substrate and buffer layers 402. Portion 402 as shown in FIG. 4 may include one or more semiconducting layers, one or more insulation layers, a combination of semiconducting layers and insulation layers, as an example. A buffer layer may be formed as the topmost layer of portion 402. A polysilicon layer (e.g., an LTPS layer) may be formed on the buffer layer, thereafter, patterned and etched to form LTPS region 406. The two opposing ends of LTPS region 406 may be doped (e.g., p-doped) to form source-drain regions of switching transistor 30. As an example, the two opposing ends of LTPS region 406 may be doped after forming the gate structure of transistor 30. If desired, switching transistor 30 may be formed with n-doped source drain regions.

Gate insulator layer 408 may be formed on portion 402 and LTPS region 406. A first metal layer (e.g., a first gate metal layer) may be formed over the gate insulator layer 408. The first metal layer may be patterned and etched to form gate structure Gate1 of transistor 30. Dielectric layers 412 and 414 may be formed over gate structure Gate 1 and transistor circuitry 30. Dielectric layers 412 may be formed from silicon nitride, while dielectric layer 414 may be formed form silicon nitride, as an example. If desired, any suitable dielectric materials may form layers 412 and 414. Portions of layers 408, 412, and 414 above a first source-drain region of transistor 30 (e.g., the left source-drain region of transistor 30 as shown in FIG. 4) may be etched to form contact holes. A metal contact (e.g., via 418-1 or contact 418-1) may be formed from metal contact layer CNT1 (sometimes referred to herein as contact CNT1) in the etched region to contact the left source-drain region of transistor 30. Portions of layers 408, 412, and 414 above a second source-drain region of transistor 30 (e.g., the right source-drain region of transistor 30 as shown in FIG. 4) may also be etched to form additional contact holes. An additional metal contact (e.g., contact 418-2) may be formed in the etched region to contact the right source-drain region of transistor 30. Contact 418-2 may also be formed in metal contact layer CNT1.

Metal portions SD1 may be all formed simultaneously. In other words, a metal layer (e.g., interconnection metal layer SD1, sometimes referred to herein as source-drain metal layer SD1) may be provided, and thereafter, patterned to form metal segments 416 and 420 and metal segments on top of metal contact layer CNT1 (e.g., capping contacts 418-1 and 418-2). Metal segment 416 (sometimes referred to herein as metal structure 416) may form a portion of drive transistor 28 to improve transistor performance (e.g., to provide better current-voltage characteristics such as a flatter saturation current profile). Metal segment 420 may form a portion of storage capacitor Cst as a capacitor electrode (sometimes referred to herein as a capacitor place or capacitor terminal). Dielectric layer 422 (sometimes referred to herein as a passivation layer) may be formed over metal segments 416 and 420 and contacts 418-1 and 418-2. Dielectric layer 422 may also form a portion of storage capacitor Cst. In particular, a portion of dielectric layer 422 may be a capacitor dielectric layer.

An IGZO layer may be formed over dielectric layer 422. The IGZO layer may be patterned and etched to form IGZO segments 424 and 426. As previously described in FIG. 3A, an insulation layer (e.g., gate insulator layer 428) may be formed on IGZO segments 424 and 426 and portions of dielectric layer 422. A second gate metal layer may be formed on gate insulator layer 428. The second gate metal layer may be patterned and etched to form a gating element of transistor 28 (e.g., gate structure Gate2). Source-drain regions of IGZO segment 424 and IGZO segment 426 may be doped as similarly described in FIG. 3A (e.g., via hydrogenation, via ion implantation). Passivation layer 430 may similarly be formed over gate structure Gate2.

IGZO segment 426 may form a first electrode of storage capacitor Cst. IGZO regions 424 and 426 may be formed in the same semiconducting-oxide layer (e.g., a patterned IGZO layer using the same mask). Metal segment 420 may form a second electrode of storage capacitor Cst. Portions of dielectric layer 422 between segments 426 and 420 may form the dielectric material between the first and second electrodes of storage capacitor Cst.

Contact holes for metal contacts to both source-drain terminals of transistor 28, metal contacts to contact 418-1, and both electrodes (e.g., electrodes 420 and 426) of storage capacitor Cst may be formed by etching through one or more layers of layers 430, 428, and 422. An additional metal contact layer (e.g., metal contact layer CNT2, sometimes referred to herein as contact CNT2) may be formed to fill the etched contact holes thereby forming respective contacts to transistors 28 and 30, and capacitor Cst.

A planarization layer (e.g., planarization layer 432) may be formed on passivation layer 430, and consequently, on the transistor and capacitor structures. Interconnections between the different metal contacts of transistors and capacitors structures (e.g., interconnection metal layer SD2 sometimes referred to herein as source-drain metal layer SD2) may be formed on planarization layer 432. In particular, contact 418-2 may be coupled to a positive voltage power supply (e.g., voltage power supply 34 in FIG. 2). Contact 418-1 may be coupled to the right source-drain terminal of transistor 28 via metal contact layer CNT2 and metal layer SD2 over planarization layer 432.

In other words, a conductive routing path may couple transistor 28 to transistor 30. The conductive routing path may include three vias, two of which are formed in metal contact layer CNT2 and one of which is formed in metal contact layer CNT1. Source-drain metal layer SD2 may couple the two vias in metal contact layer CNT2 to each other. The conductive routing path may include a first terminal contact coupled to transistor 28 and a second terminal contact coupled to transistor 30. The first terminal contact may include only one via, whereas the second terminal contact may include two vias.

An additional planarization layer (e.g., planarization layer 434) may be formed on planarization layer 432 and over the metal interconnections on planarization layer 432 (e.g., over the conductive routing path). Planarization layer 432 and 434 may be formed from organic dielectric materials such as a polymer. In contrast with layers 430, 428, 422, 414, 412, and 480, which may be formed from inorganic dielectric material such as silicon nitride, silicon oxide, etc.

Anode 436 may be formed over planarization layer 434 and may be coupled to the left source-drain terminal of transistor 28 via the corresponding metal interconnection on planarization layer 432. Pixel defining layer 438 (PDL 438) may be formed over anode 436 and portions of planarization layer 434. Pixel defining layer 438 may define active luminous regions of display pixels.

Additional structures may be formed over PDL 438 and anode 436. For example, light-emitting diode emissive material, cathode, and other structures may also be included in pixel 22. However, these additional structures are omitted for the sake of brevity.

Pixel circuitry 400 may also include encapsulation interface region 450 and bending region 452. As shown in FIG. 4 portions of PDL 438 and planarization layers 434 and 432 may be removed to elimination any organic materials in interface region 450, thereby minimizing the amount of moisture and contaminants that reach pixel circuitry from outside of an encapsulated pixel region. Bending region 452 may be formed to include different signal lines and power lines that are provided to the display pixels.

As shown in FIG. 4, drive transistor circuitry 28 may be formed as an IGZO transistor that incorporates a top-gate design. In particular, the IGZO transistor may be of the type as shown in FIG. 3A. Switching transistor circuitry 28 may be formed as an LTPS transistor that also incorporates a top-gate design. Furthermore, storage capacitor Cst may be formed a capacitor that includes conductive IGZO as a terminal of the capacitor.

Similar features previously described in connection with FIG. 4 are subsequently omitted from description in FIGS. 5-13 in order to avoid unnecessarily obscuring the following embodiments. Similar features (e.g., features with similar structures, features with similarly labelled reference numbers, etc.) as shown in FIGS. 5-13 may be assumed to serve similar functions as described in FIG. 4.

Figure 5:
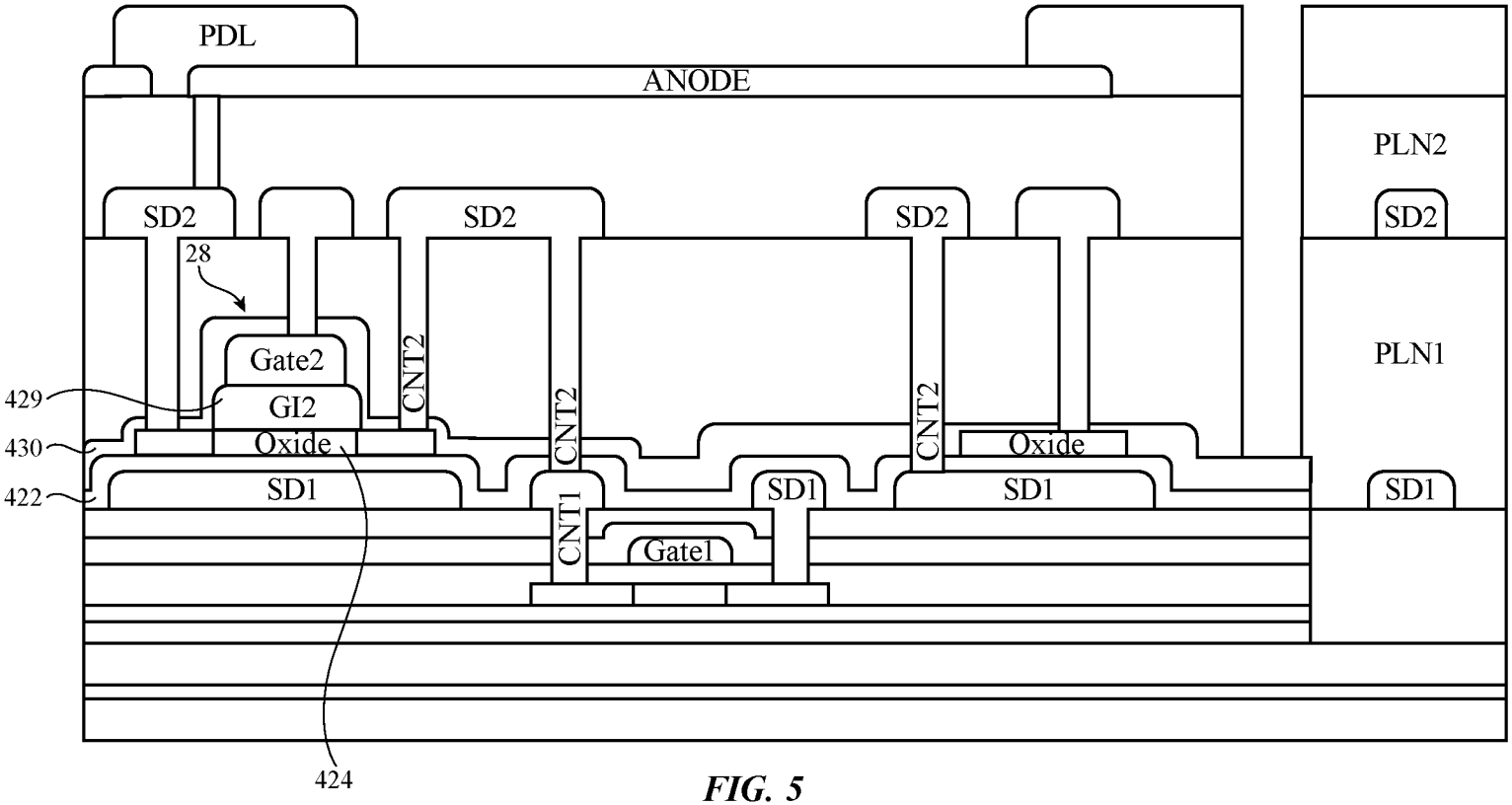
FIG. 5 is a cross-sectional side view of illustrative pixel circuitry that includes a top-gate IGZO drive transistor of the type shown in FIG. 3B in accordance with an embodiment.

In an embodiment, drive transistor circuitry 28 may include an IGZO transistor of the type as shown in FIG. 3B. In particular, the pixel circuitry as shown in FIG. 5 having drive transistor 28, which includes gate insulator 429. Gate structure Gate2, gate insulator 429, and channel region of segment 424 (i.e., IGZO layer 424 excluding doped source-drain regions) may be self-aligned. In other words, gate structure Gate2 and gate insulator 429 may be etched using a same mask, as described in FIG. 3B. The source-drain regions of the IGZO segment may also be formed using gate structure Gate2 and gate insulator 429 as a mask during plasma treatment (e.g., during dry etching of gate structure Gate2 and gate insulator 429), as an example.

Referring back to FIG. 4, pixel circuitry 400 may include multiple metal interconnections (e.g., source-drain metal layer SD2 with multiple segments coupling different transistor and capacitor structure) above planarization layer 432. As such, multiple contact holes (e.g., multiple vias CNT2) are required to access different terminals of transistors 28 and 30 and capacitor Cst to one another using the respective metal interconnections in source-drain metal layer SD2 above planarization layer 432. As an example, pixel circuitry 400 in FIG. 4 may require six total contact holes to couple positive voltage supply source 34 to anode 436. In particular, the six total contact holes include two inorganic contact holes filed by contacts CNT1 (i.e., contact holes formed in inorganic layers), two organic contact holes filled by contacts CNT2 (i.e., contact holes formed in organic layers) to couple transistor 28 to transistor 30, and two additional organic contact holes filled by contacts CNT2 that couple the transistor 28 to anode 436.

Because of the number and size of contact holes required (e.g., three of the four organic contact holes are form in planarization layer 432), layout design rules that specify spacing requirements may be violated in compact designs. Additionally, topology for planarization layer 434 may be distorted because of excess contact holes in planarization layer 432.

Figure 6A:
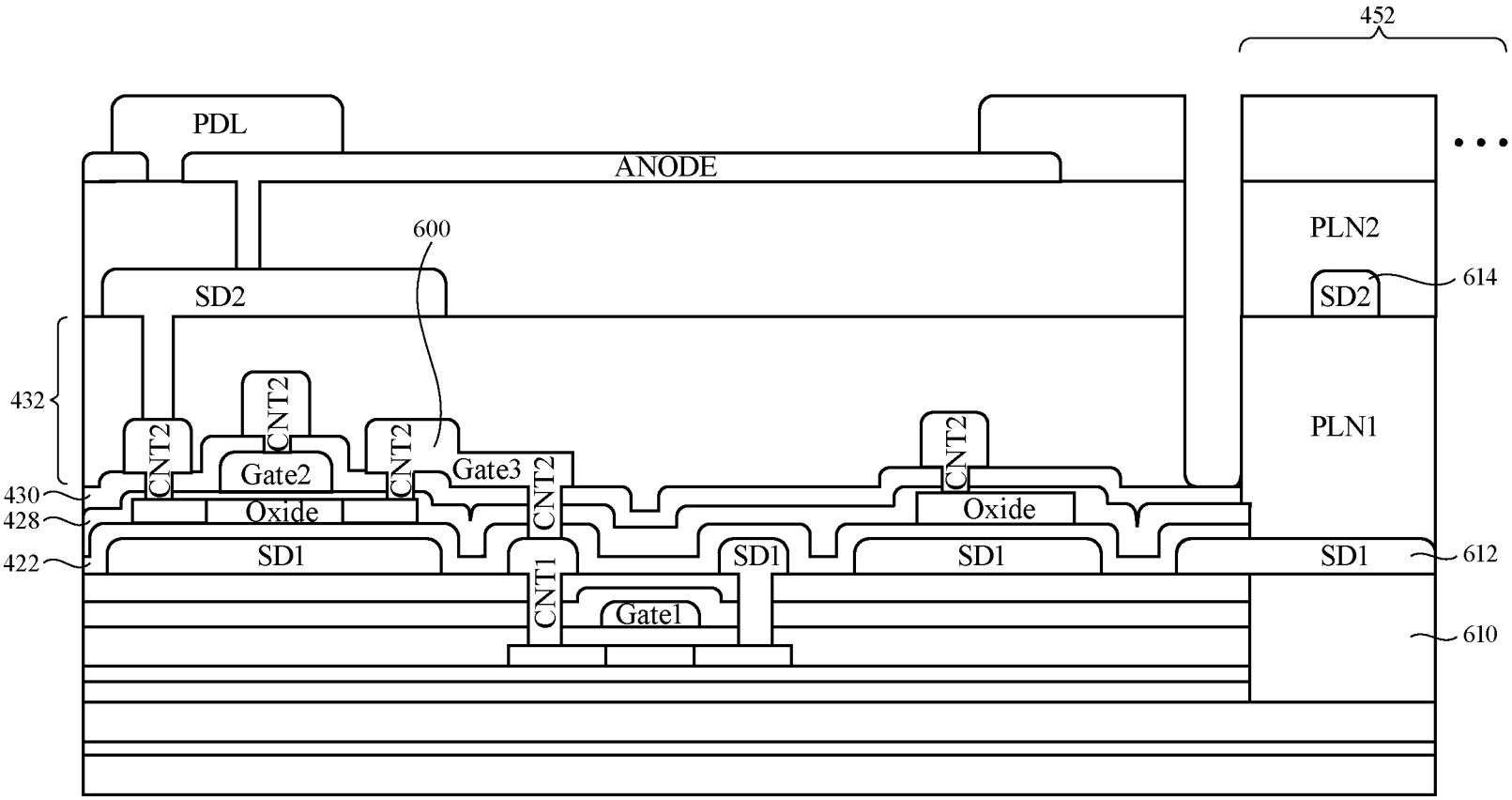
FIGS. 6A and 6B are cross-sectional side views of illustrative pixel circuitry that includes a top-gate IGZO drive transistor of the type shown in FIG. 3A and a metal layer that reduces a number of contact holes in a planarization layer in accordance with an embodiment.

In an embodiment, metal layer SD2 formed above planarization layer 432 that requires contact holes within planarization layer 432 may be reduced. As shown in FIG. 6A, an additional metal layer (e.g., metal layer 600, sometimes referred to herein as gate metal layer Gate3) may be formed on passivation layer 430. Metal contact layer CNT2 may be similarly formed on passivation layer 430 without forming contact holes through planarization layer 432.

Metal contact layer CNT2 may have two respective segments each coupled to a source-drain terminal of transistor 28, a third segment coupled to gate structure Gate2 as a metal contact and a fourth segment coupled to the conductive IGZO plate of capacitor Cst. Metal layer CNT may also have a fifth segment coupled to contact 418-2 or metal contact layer CNT1. Metal layer 600 may couple transistor 28 to transistor 30 via metal layer CNT2. As compared to pixel circuitry 400 as shown in FIG. 4, the pixel circuitry in FIG. 6A only includes two organic contact holes, one of which is in planarization layer 432 and the other one of which is in planarization layer 434. As previously described, an organic contact hole is defined as a contact hole formed in an organic layer (e.g., planarization layer 432), whereas an inorganic contact hole is defined as a contact hole formed in an inorganic layer (e.g., passivation layer 430).

As shown in FIG. 6A, bending region 452 may include planarization layer 610 formed on a substrate (e.g., a substrate in portion 402 as described in FIG. 4). As an example, planarization layer 610 may be formed from organic polymers, such as polyimide or polyacryl. Source-drain metal layer SD1 may also include a segment (e.g., metal segment 612) formed in bending region 452. Segment 612 may be formed on planarization layer 610, which may level (e.g., flatten) the topology in the bending region (with respectful to the pixel circuitry region) before depositing metal layer SD1. Planarization layer 432 may be formed over metal layer SD1. Planarization layer 432 may also serve to flatten the topology before depositing an additional metal layer on top. Source-drain metal layer SD2 may also be formed in bending region 452. In particular, metal layer SD2 may be formed on planarization layer 432. Planarization layer 434 and PDL 438 layer may be subsequently formed over metal layer SD2.

Figure 6B:
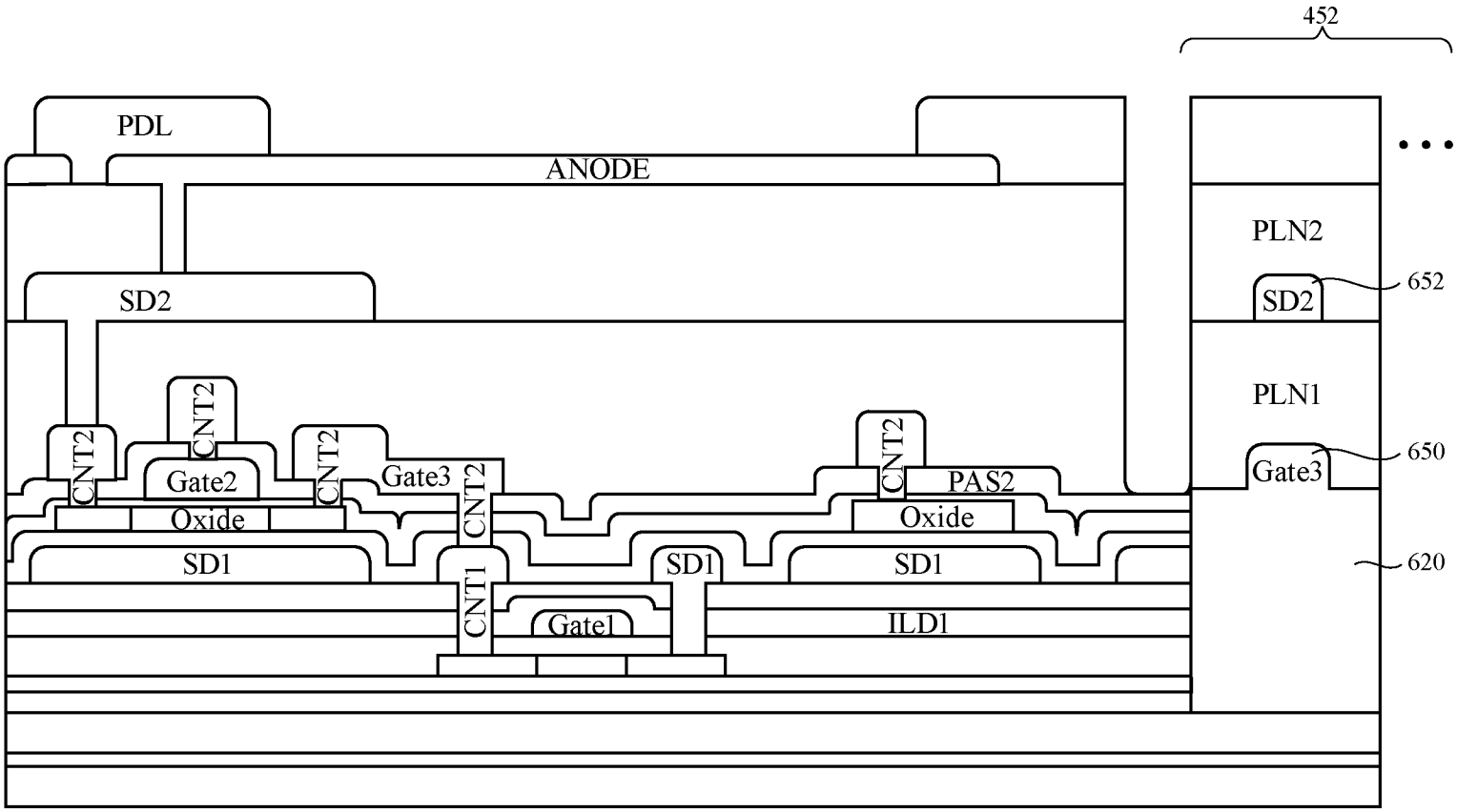

If desired, a portion of third gate metal layer Gate3 (e.g., segment 650) may be formed in bending region 452, as shown in FIG. 6B. In particular, planarization layer 620 may be formed on a substrate (e.g., a substrate in portion 402 as described in FIG. 4) and serve a similar function as planarization layer 610 in FIG. 6A. As an example, planarization layer 620 may be thicker (e.g., have a larger height) than planarization layer 610 in FIG. 6A because gate metal layer Gate3 may be in higher level than metal layer SD1 in a process stack-up. Planarization layer 432 may be formed on gate metal layer segment 650, and metal layer SD2 may be formed on planarization layer 432. If desired, any number of additional metal layers (with corresponding planarization layers) may also be formed in bending region 452 to provide a suitable number interconnections in bending region 452. Planarization layer 434 and PDL 438 may be formed on metal layer SD2.

Figure 7:
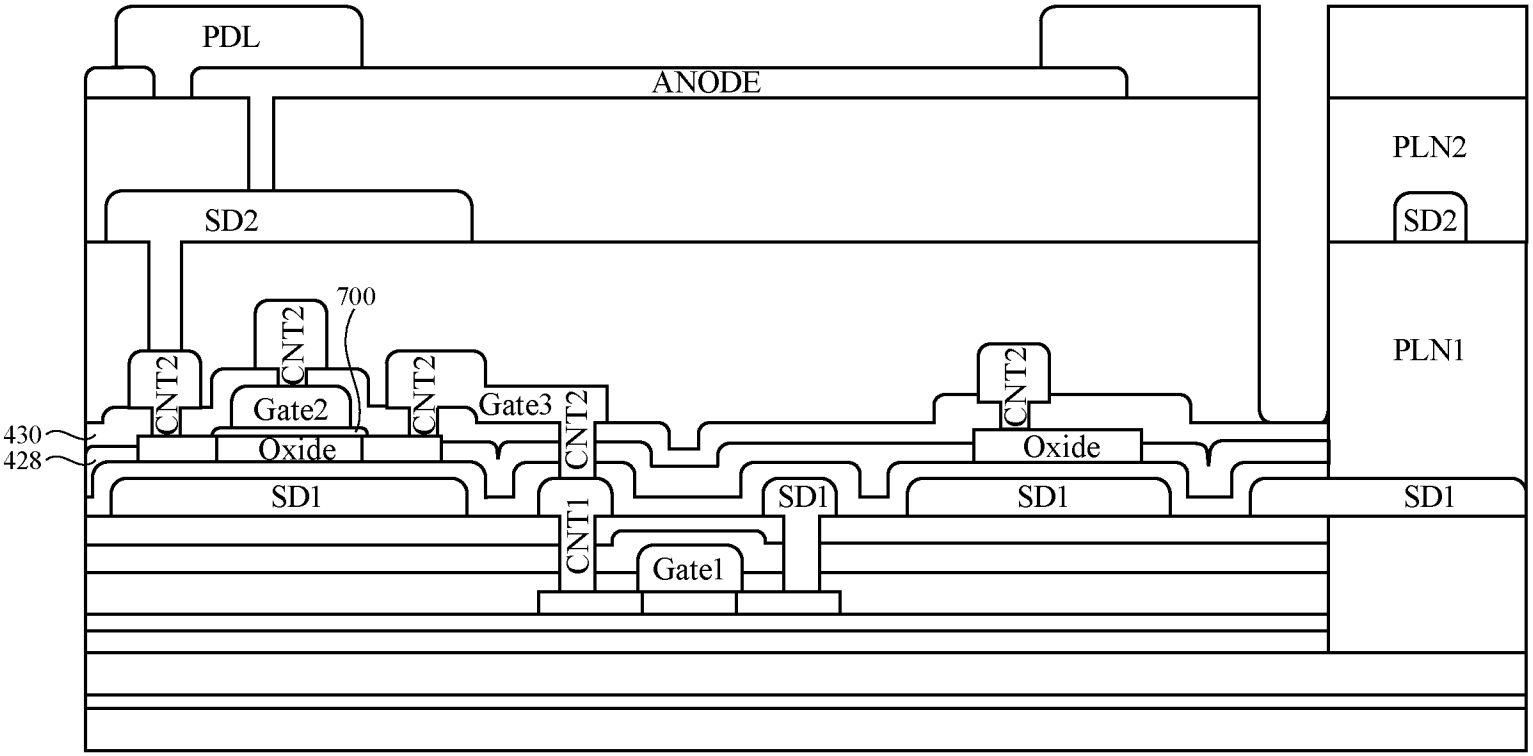
FIG. 7 is a cross-sectional side view of illustrative pixel circuitry that includes a top-gate IGZO drive transistor of the type shown in FIG. 3B and a metal layer that reduces a number of contact holes in a planarization layer in accordance with an embodiment.

Similar to FIG. 4, drive transistor circuitry 28 of FIGS. 6A and 6B may both be top-gate IGZO transistors of the type as shown in FIG. 3A. Alternatively, drive transistor 28 may be formed as a top-gate IGZO transistor of the type as shown in FIG. 3B. In particular, as shown in FIG. 7, gate insulator 700 similar to gate insulator 429 as shown in FIG. 5. In other words, transistor 28 in FIG. 7 may include gate insulator 700 that is vertically aligned with gate structure Gate2.

Although FIGS. 5 and 7 described drive transistor 30 as a type of top-gate IGZO transistor as shown and described in FIG. 3B, if desired, the IGZO transistor structure of FIG. 3C may also be used.

Figure 8:
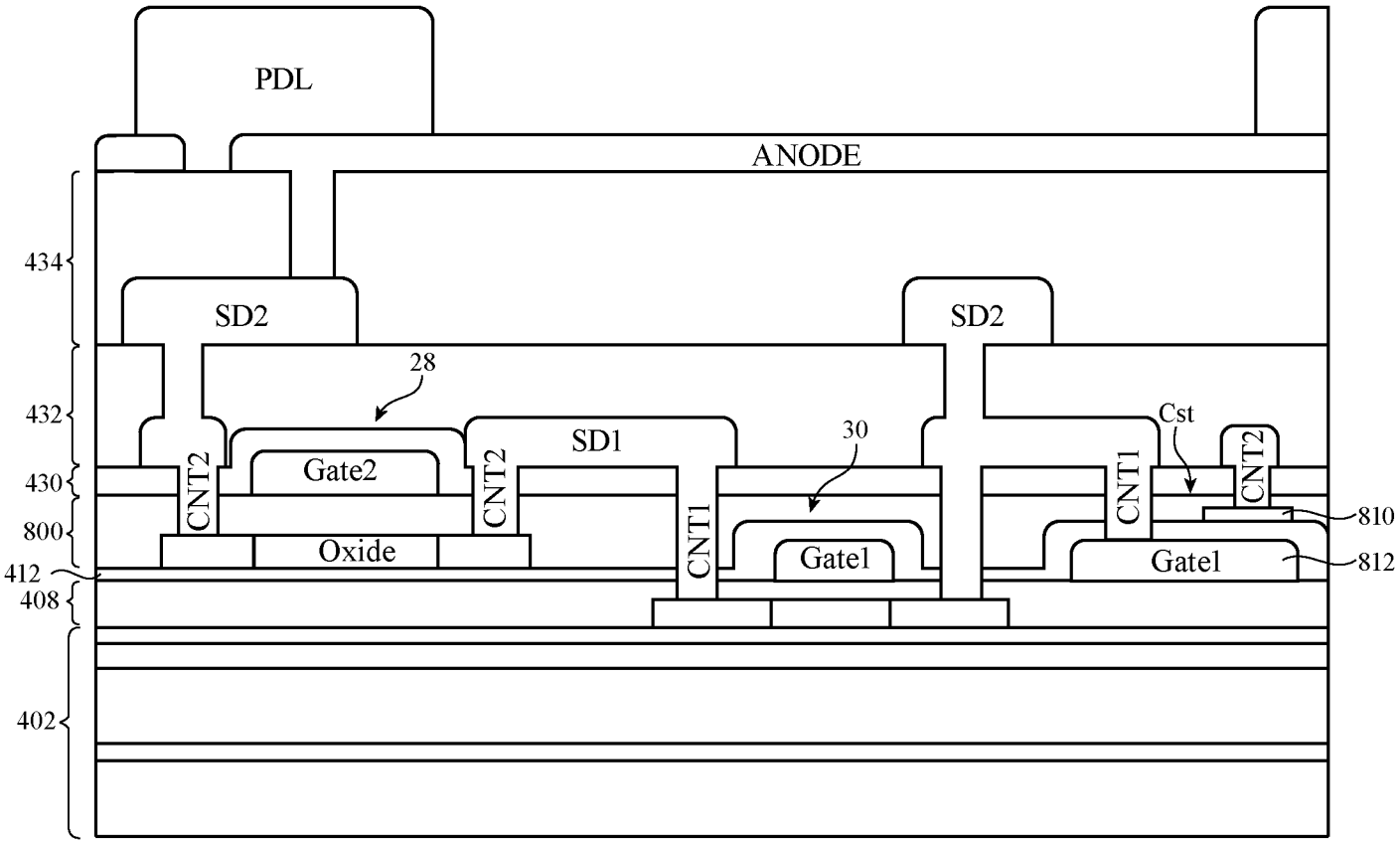
FIG. 8 is a cross-sectional side view of illustrative pixel circuitry that includes source-drain metal layer formed above a top-gate IGZO drive transistor in accordance with an embodiment.

As shown in FIGS. 4-7, interconnection metal layer SD1 may be formed between gate metal layer Gate1 and IGZO layer 424. If desired, interconnection metal layer SD1 may be formed over gate metal layer Gate2, as shown in FIG. 8. Forming metal layer SD1 in such a configuration may reduce a number of masks used in the fabrication process as well as a number of inorganic contact holes (as compared to the pixel circuitry described in FIGS. 6 and 7).

In FIG. 8, transistor 30 may be formed on a topmost layer (e.g., a buffer layer) in portion 402. Gate insulator layer 408 may similarly be formed over a LTPS layer (similar to LTPS region 406 in FIG. 4). Because interconnection metal layer SD1 is formed above passivation layer 430, the first gate metal layer (in which gate structure Gate1 in FIG. 4 is formed) may form both a gate structure for transistor 30 and as an electrode for capacitor Cst (e.g., capacitor plate 812). Therefore, inter-layer dielectric layer 412 may cover both gate structure Gate1 and capacitor plate 812. Inter-layer dielectric layer 412 may also be used as the capacitor dielectric for storage capacitor Cst.

Similar to FIG. 4, IGZO portion 424 may be formed as a portion of transistor 28, while IGZO portion 810 may be formed a portion of capacitor Cst (e.g., capacitor electrode 810). IGZO portions 424 and 810 may be formed in the same IGZO layer during processing (e.g., by using the same IGZO layer patterned by a single mask). Insulation layer 800 may be formed over both IGZO portions 424 and 810. Insulation layer 800 may also form the gate insulator of transistor 28. Gate structure Gate2 may form the gating element of transistor 28. Passivation layer 430 may be formed over gate metal layer Gate2.

Additionally, if desired, metal contact layers CNT1 and CNT2 may be formed in the same step (e.g., using a single mask) using etch holes formed through one or more layers 430, 800, 412, and 408. Alternatively, metal contact layers CNT1 and CNT2 may be separately formed. Interconnection metal layer SD1 may be formed over passivation layer 430 and may couple transistor structures and capacitor structures to one another. For example, metal layer SD1 may couple a source-drain region of transistor 28 to a source-drain region of transistor 30. As another example, metal layer SD1 may couple a terminal of storage capacitor Cst (e.g., capacitor terminal 812) to a source-drain terminal of transistor 30. Metal layer SD2 may also be connected to the portion of metal layer SD1 coupled to both the terminal of storage capacitor Cst and the source-drain terminal of transistor 30. A positive power supply voltage may be provided to the portion of metal layer SD1, if desired.

Still referring to FIG. 8, a conductive routing path may also couple transistor 28 to transistor 30. In contrast with the routing path referred to in FIG. 4, the conductive routing path of FIG. 8 only includes one via in contact CNT2, one via in contact CNT1, and a source-drain metal layer that couples the one via in contact CNT2 and one via in contact CNT1. In other words, a first terminal contact of the conductive routing path coupled to transistor 28 includes only one via. A second terminal contact of the conductive routing path coupled to transistor 30 also includes only one via.

Figure 9:
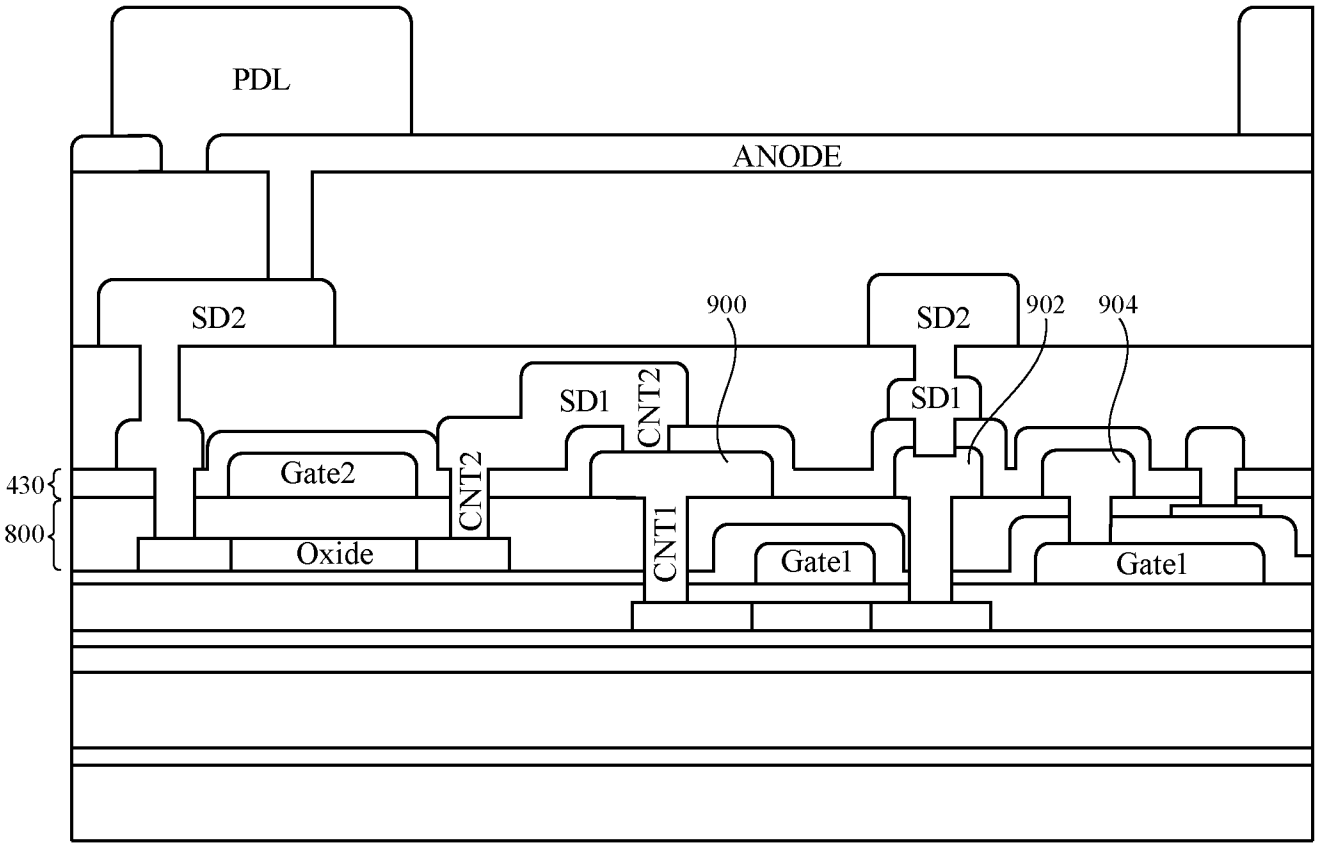
FIG. 9 is a cross-sectional side view of illustrative pixel circuitry what includes a contact via formed in the same layer as a gate structure of a top-gate IGZO drive transistor in accordance with an embodiment.

Because the two contact holes (contacts CNT1 and CNT2) formed to couple transistor 28 to transistor 30 have different depth, contact issues may arise when forming metal contacts to fill the two contact holes. For example, an etch process may etch through the right source-drain region of transistor 28 while trying to achieve the correct depth of contact CNT1 to access the left source-drain region of transistor 30. Therefore, after forming the contact hole for the left source-drain region of transistor 30, it may be desirable to fill the contact hole as soon as possible. As shown in FIG. 9, gate structure Gate2 may be formed in a gate metal layer. In order to fill the contact hole of contacts CNT1 separately from contacts CNT2, the gate metal layer in which gate structure Gate2 is formed, may also form metal vias 900, 902, and 904. In other words, gate structure Gate2 may be simultaneously formed with contacts CNT1 to fill the formed contact holes immediately. Accordingly, passivation layer 430 may be formed to cover gate structure Gate2 and metal vias 900, 902, and 904. Thereafter, metal contact layer CNT2 and interconnection metal layer SD1 may be formed as previously described in FIG. 8.

Figure 10:
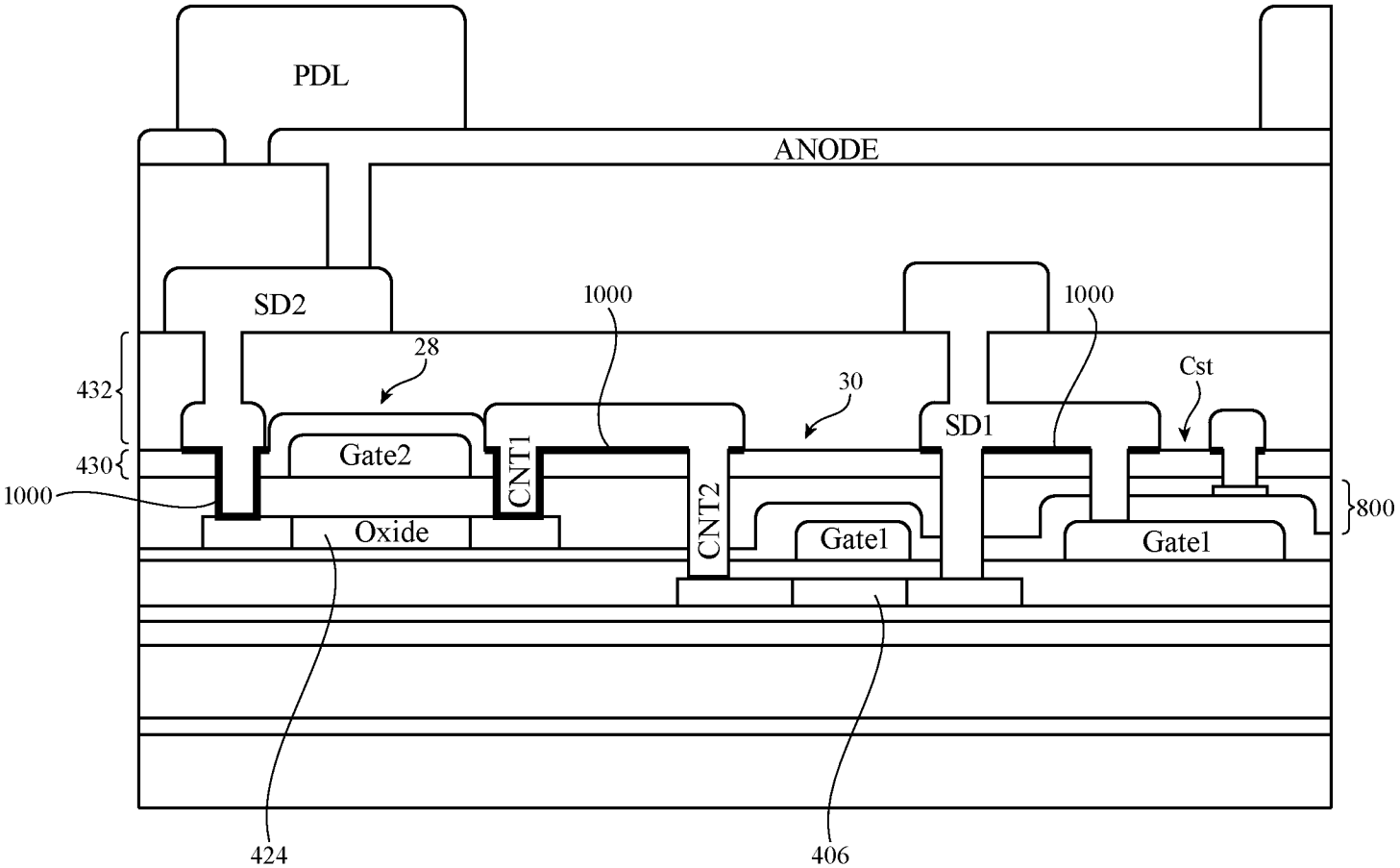
FIG. 10 is a cross-sectional side view of illustrative pixel circuitry that includes a protective metal film for contacting source-drain regions of a top-gate IGZO drive transistor in accordance with an embodiment.

As shown in FIG. 10, an additional metal layer (e.g., metal layer 1000) may be formed before forming metal contact layer CNT1, but following patterning based on the metal layer CNT1 mask. Metal layer 1000 may be a protective metal film that prevents over-etching problems previously described in connection with FIG. 8. Metal layer 1000 may therefore sometimes be referred to as etch-stop liner 1000.

Metal layer 1000 may be interposed between source-drain metal layer SD1 and passivation layer 430. Additionally, metal layer 100 may also be interposed between contacts CNT1 and both source-drain regions of transistor 28. As an example, Metal layer 1000 may be formed from Molybdenum, Tungsten, or any other suitable materials. Metal layer 1000 may protect IGZO layer 424 from over-etching as well as ensure good electrical contact to the source-drain regions of transistor 28.

Figure 11:
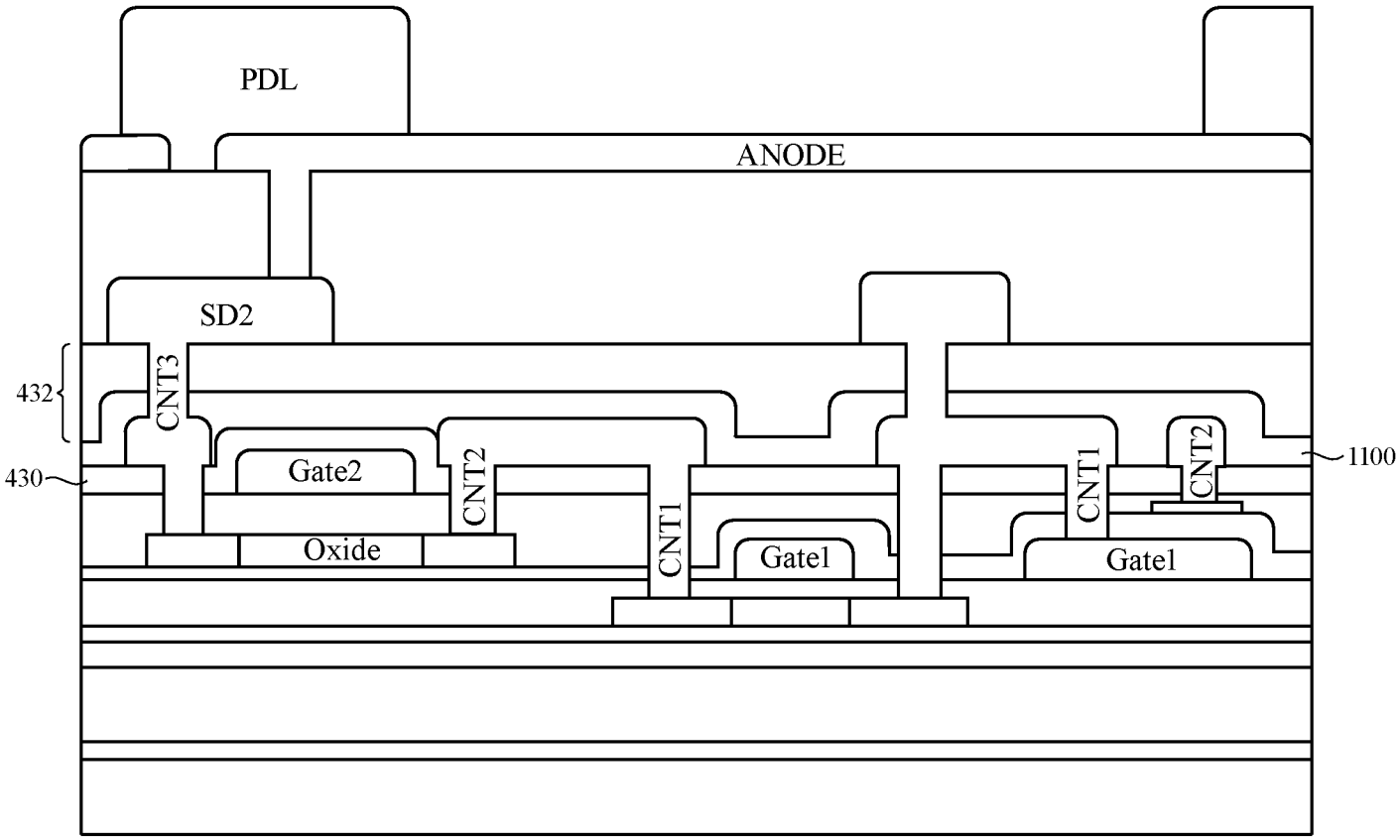
FIG. 11 is a cross-sectional side view of illustrative pixel circuitry of the type in FIG. 8 that further includes a passivation layer in accordance with an embodiment.

As shown in FIG. 11, the pixel circuitry of FIG. 8 may include passivation layer 1100 formed over interconnection metal layer SD1 and portion of passivation layer 430. As an example, passivation layers 430 and 1100 may be formed from silicon nitride. If desired, any other suitable material may be used as the passivation layers. The addition of passivation layer 1100 may prevent moisture and other contaminants from entering metal layer SD1.

Figure 12:
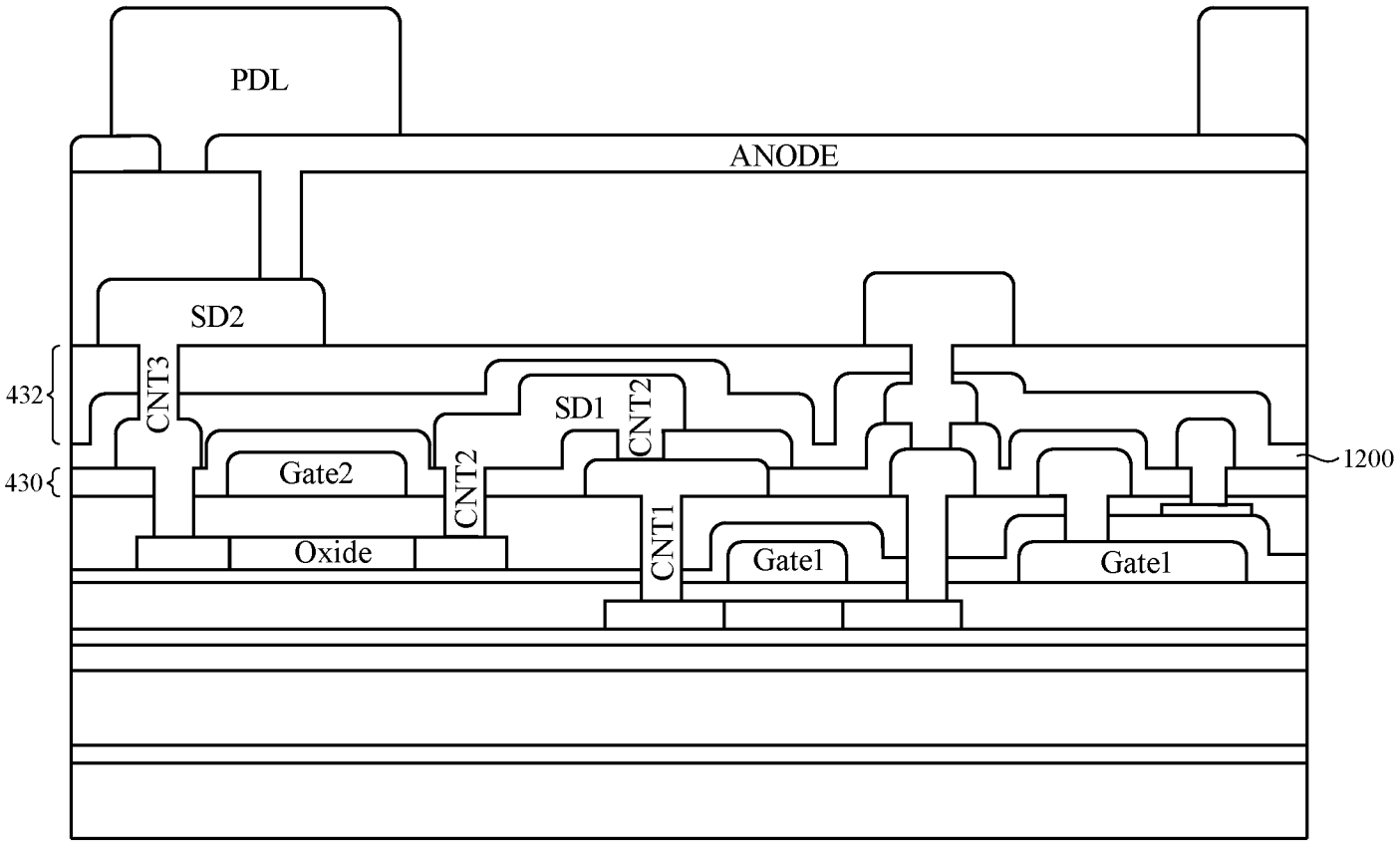
FIG. 12 is a cross-sectional side view of illustrative pixel circuitry of the type in FIG. 9 that further includes a passivation layer in accordance with an embodiment.

In an embodiment, the pixel circuitry of FIG. 9 may include passivation layer 1200 formed over interconnection metal layer SD1. A configuration of this type is shown in FIG. 12.

Figure 13:
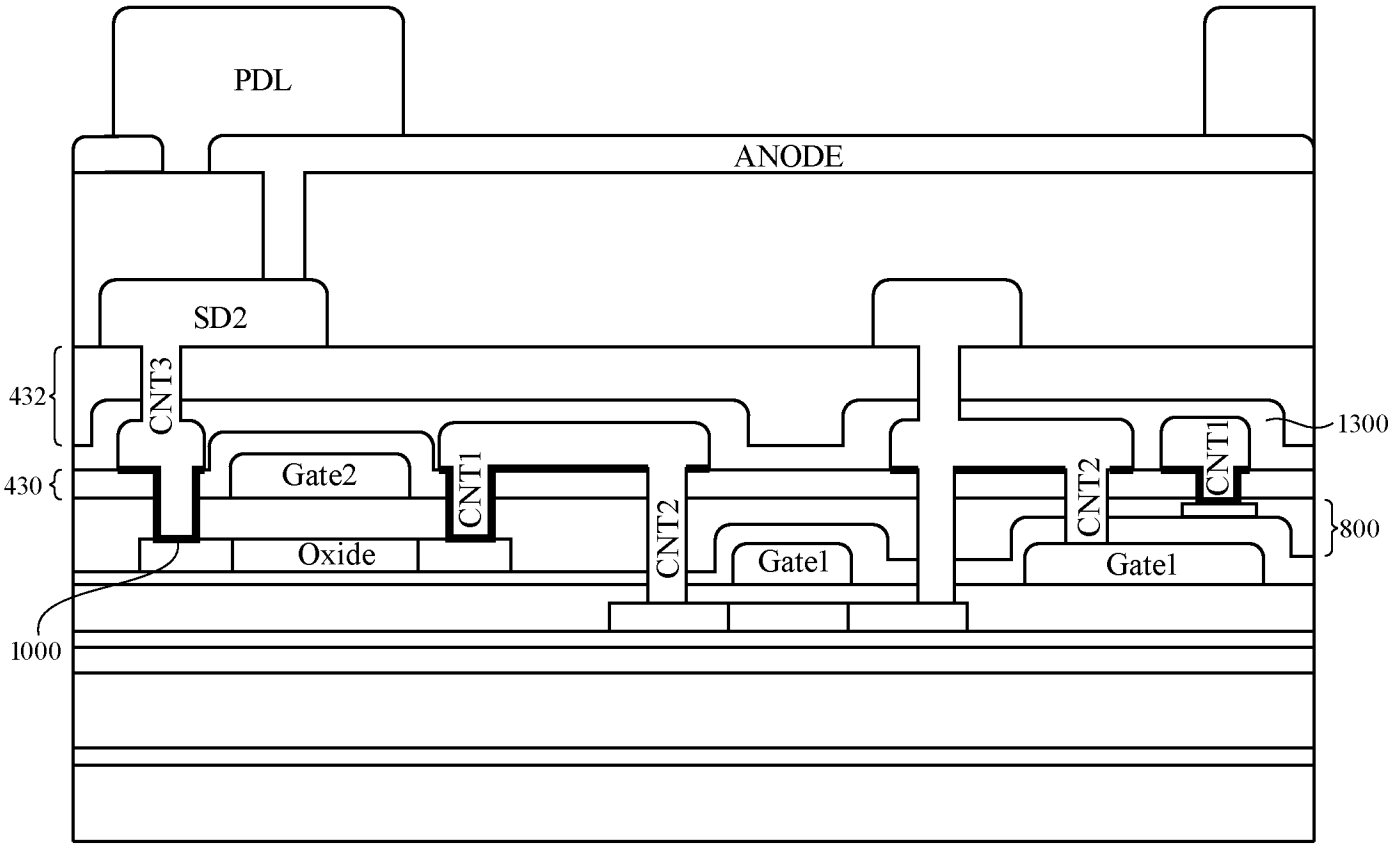
FIG. 13 is a cross-sectional side view of illustrative pixel circuitry of the type in FIG. 10 that further includes a passivation layer in accordance with an embodiment.

In an embodiment, the pixel circuitry of FIG. 10 may include passivation layer 1300 formed over interconnection metal layer SD1. A configuration of this type is shown in FIG. 13.

The foregoing is merely illustrative and various modifications can be made by those skilled in the art without departing from the scope and spirit of the described embodiments. The foregoing embodiments may be implemented individually or in any combination.

What is claimed is:

1. A display comprising:

a semiconducting-oxide drive transistor, wherein the semiconducting-oxide drive transistor is a top-gate transistor;

a storage capacitor coupled to the drive transistor, wherein the storage capacitor comprises conductive oxide, and wherein the storage capacitor is formed in the same layer in the display as the semiconducting-oxide drive transistor;

a silicon switching transistor coupled to the semiconducting-oxide drive transistor, wherein the silicon switching transistor is formed on a substrate, and wherein the semiconducting-oxide drive transistor is formed above the silicon switching transistor;

an organic layer formed on the semiconducting-oxide drive transistor;

a metal layer laterally coupling a source-drain terminal of the semiconducting-oxide drive transistor to a source-drain terminal of the silicon switching transistor, wherein the metal layer is not formed through the organic layer; and a conductive structure electrically coupled to a gate conductor of the top-gate transistor, wherein the conductive structure is not formed through the organic layer.

2. The display of claim 1, further comprising:

a light-emitting diode coupled in series with the drive transistor.

3. The display of claim 2, wherein the silicon switching transistor is configured to selectively pass current through the drive transistor to the light-emitting diode.

4. The display of claim 2, further comprising:

a first power supply line; and a second power supply line, wherein the semiconducting-oxide drive transistor, the silicon switching transistor, and the light-emitting diode are coupled in series between the first and second power supply lines.

5. The display of claim 1, further comprising:

a light-emitting diode coupled in series with the drive transistor; and an additional organic layer formed on the organic layer, wherein the light-emitting diode has an anode layer that is formed on the additional organic layer.

6. The display of claim 1, further comprising:

a conductive segment formed in a bending region of the display, the conductive segment and the metal layer are at least partially formed in the same gate metal layer.

7. The display of claim 1, further comprising:

a conductive structure formed directly below the semiconducting-oxide drive transistor in a given metal layer; and a storage capacitor coupled to the drive transistor, the storage capacitor comprises a capacitor plate in the given metal layer.

8. The display of claim 1, wherein the silicon switching transistor comprises a gate structure formed in a given metal layer, the display further comprising:

a storage capacitor coupled to the drive transistor, the storage capacitor comprises a capacitor plate in the given metal layer.

9. The display of claim 1, wherein the semiconducting-oxide drive transistor does not include a bottom gate.

10. A display comprising:

a drive transistor having a gate terminal and a source terminal;

a metal segment formed directly below the drive transistor;

a capacitor coupled to the drive transistor, wherein the capacitor comprises a first terminal formed from conductive oxide and a second terminal formed from an additional metal segment separate from the metal segment, wherein the additional metal segment is formed in the same layer as the metal segment, and wherein the capacitor is configured to store a voltage across the gate and source terminals of the drive transistor.

11. The display of claim 10, further comprising:

a light-emitting diode coupled in series between the drive transistor.

12. The display of claim 10, further comprising:

a dielectric layer formed below the drive transistor, wherein the drive transistor comprises semiconducting-oxide material, and wherein the conductive oxide of the capacitor and the semiconducting-oxide material of the drive transistor are formed on the dielectric layer.

13. The display of claim 10, further comprising:

a switching transistor coupled to the drive transistor, wherein the switching transistor has a gate formed below the metal segment.

14. The display of claim 10, further comprising:

a capacitor; and an additional routing path coupling the capacitor to the switching transistor, wherein the routing path and the additional routing path include lateral routing portions that are formed in the same layer.

15. A display comprising:

a drive transistor having a source-drain terminal;

a switching transistor coupled to the drive transistor;

a conductive routing path having a first terminal contact that is coupled to the drive transistor and a second terminal contact that is coupled to the switching transistor; and a conductive etch-stop liner interposed between the source-drain terminal of the drive transistor and the first terminal contact.

16. The display of claim 15, wherein the drive transistor comprises semiconducting-oxide and the switching transistor is a silicon transistor.

17. The display of claim 16, wherein the drive transistor is a top-gate transistor.

18. The display of claim 15, wherein the second terminal contact of the conductive routing path comprises only one via.

*19. A display comprising:*

*a semiconducting-oxide transistor having a semiconducting-oxide layer;*

*a conductor formed directly below the semiconducting-oxide layer of the semiconducting-oxide transistor; and*

*a capacitor coupled to the semiconducting-oxide transistor, wherein the capacitor comprises a first terminal and a second terminal that is formed from an additional conductor separate from the conductor, and wherein the additional conductor is formed in the same layer as the conductor.*

*20. The display of claim 19, further comprising:*

*a light-emitting diode coupled to the semiconducting-oxide transistor.*

*21. The display of claim 19, further comprising:*

*a switching transistor coupled to the semiconducting-oxide transistor, wherein the switching transistor has a gate formed in a layer below the conductor.*

*22. The display of claim 20, wherein the semiconducting-oxide transistor comprises a metal layer that includes molybdenum.*

*23. The display of claim 21, further comprising:*

*a first planarization layer formed over the semiconducting-oxide transistor; and*

*a second planarization layer formed on the first planarization layer.*

* * * * *